United States Patent [19]
Andrews et al.

[11] Patent Number: 4,551,636
[45] Date of Patent: Nov. 5, 1985

[54] WIDE BANDWIDTH SIGNAL COUPLING CIRCUIT HAVING A VARIABLE VOLTAGE-LEVEL SHIFT FROM INPUT TO OUTPUT

[75] Inventors: Roland E. Andrews, Portland; John L. Addis, Beaverton, both of Oreg.

[73] Assignee: Tektronix, Inc., Beaverton, Oreg.

[21] Appl. No.: 497,917

[22] Filed: May 25, 1983

[51] Int. Cl.⁴ .............................................. H03K 5/00
[52] U.S. Cl. ............................. 307/264; 307/296 R; 307/475; 307/494; 307/558; 333/81 R
[58] Field of Search ................. 307/200 A, 475, 443, 307/493, 494, 264, 555, 556, 558, 296 R; 330/126; 333/81 R

[56] References Cited

U.S. PATENT DOCUMENTS

| | | | |
|---|---|---|---|
| 3,393,369 | 7/1968 | Embley et al. | 307/493 |
| 3,781,694 | 12/1973 | Lefevre et al. | 307/493 |
| 3,845,416 | 10/1974 | Dolby | 330/126 |
| 4,142,110 | 2/1979 | Weber | 307/555 |

*Primary Examiner*—John Zazworsky
*Attorney, Agent, or Firm*—George T. Noe

[57] ABSTRACT

A signal coupling circuit suitable for use in a high-speed signal acquisition probe comprises separate high-frequency and low-frequency signal transmission paths from input to output. The low-frequency path includes a mechanism for variably shifting the DC voltage level at the circuit input to offset quiescent or average voltage levels of an input signal. Values of impedance elements for both the high-frequency and low-frequency transmission paths may be selected to provide predetermined input and output impedances without compromising signal fidelity or limiting signal bandwidth.

3 Claims, 1 Drawing Figure

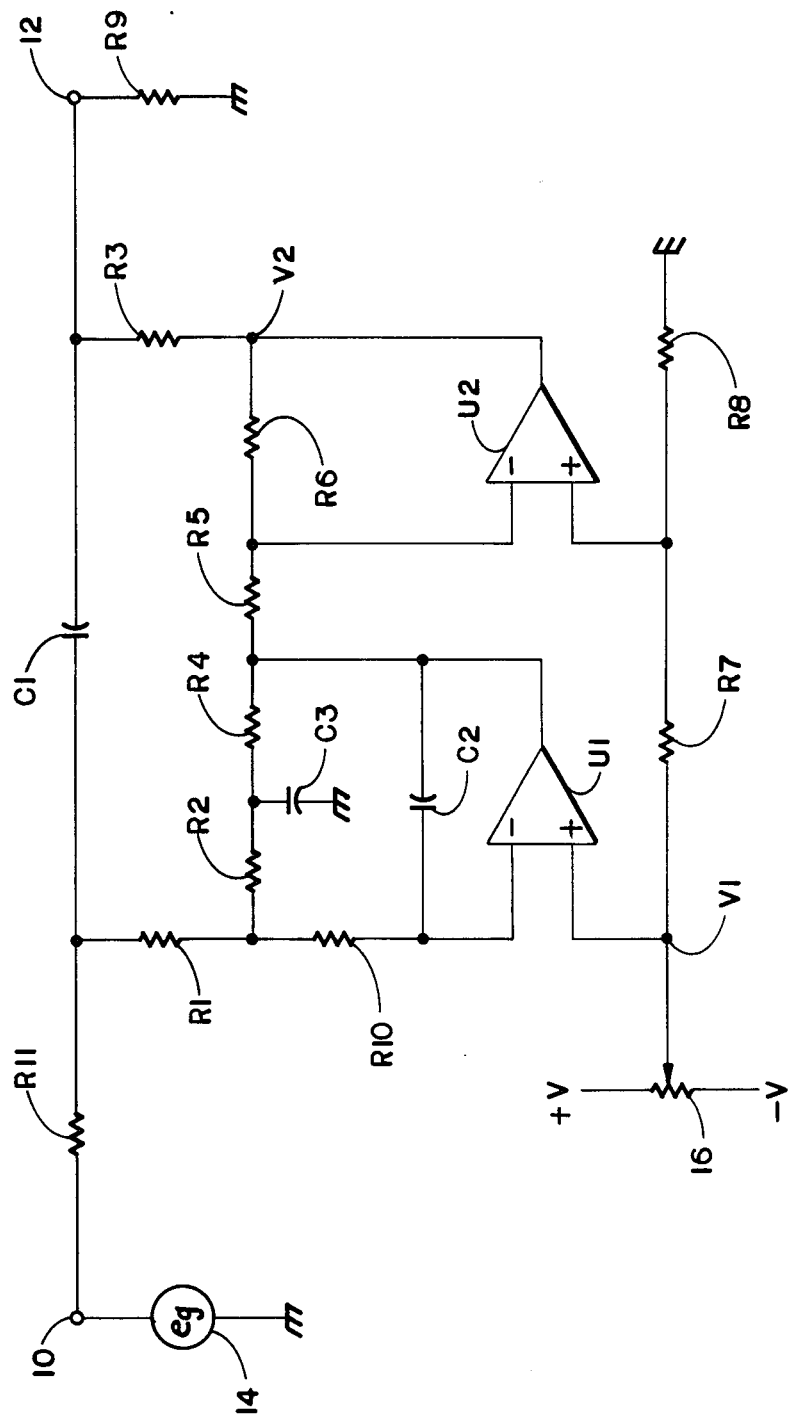

WIDE BANDWIDTH SIGNAL COUPLING CIRCUIT HAVING A VARIABLE VOLTAGE-LEVEL SHIFT FROM INPUT TO OUTPUT

BACKGROUND OF THE INVENTION

The present invention relates generally to signal coupling circuits, and in particular to a wide bandwidth signal coupling circuit having a variable DC voltage-level shift from input to output. Electronic signal-processing circuits are typically grouped in stages which are coupled together in such a manner that each stage may perform its intended operation without influencing or being influenced by the remaining stages, and without degrading signal fidelity. A very commonly encountered problem in connecting these stages together is that at the appropriate points of connection the signals or logic levels may have quiescent or average values which are other than zero volts.

A typical method of coupling circuit stages together is by coupling capacitors or transformers; however, these methods are not practical if DC information is to be preserved. In situations in which DC information is needed, Zener diodes or even batteries are sometimes used to provide a fixed DC level shift. However, these devices introduce an uncertain resistance value in series with the input signal path, resulting in difficulties in impedance matching. Moreover, the inherent capacitance of these devices serves to limit the frequency bandwidth of signals being transmitted therethrough.

Another method of signal coupling is the use of a resistive divider; however, the problem associated with such dividers is that the signal is attenuated and perhaps limited in signal bandwidth. In a case in which the resistive divider is part of a passive attenuator probe, other problems become apparent. Consider, for example, the loading effects on a logic family such as emitter-coupled logic (ECL). ECL logic is most commonly operated from a −5.2-volt supply with $V_{cc}$ connected to ground. In this configuration, the high signal level is approximately −0.8 volts and the low signal level is approximately −1.7 volts. The output of a typical ECL gate is the emitter of an NPN emitter follower transistor, the collector of which is connected to ground. The output is pulled down to a negative supply (usually about −2 volts) with an external pull-down resistor (usually 50 to 100 ohms). Since speed is a major consideration in ECL designs, the interconnections between logic gates are often transmission lines, and the pull-down resistor doubles as a line termination. If a conventional 500-ohm, 10× passive probe were used in conjunction with an oscilloscope to examine an ECL output, the probe's 500-ohm resistance to ground would form a voltage divider with the output termination resistor of the particular logic gate being examined. This divider can cause severe distortion of the output signal level, shift the DC operating point of the output transistor of the logic gate, and greatly reduce the gate's noise margin.

SUMMARY OF THE INVENTION

In accordance with the present invention, a signal coupling circuit is provided with separate high-frequency and low-frequency signal paths for transmission of wide bandwidth signals, and the low-frequency signal path includes a mechanism for variably shifting the DC voltage level at the circuit input to offset quiescent or average voltage levels of input signals.

A feature of the invention is that the values of impedance elements for both the high-frequency and low-frequency transmission paths may be selected to provide predetermined input and output impedances for impedance matching purposes without compromising signal fidelity or limiting the signal bandwidth. Thus, the signal coupling circuit of the present invention is suitable for a wide variety of applications, such as, for example, for 50-ohm systems, since the input impedance may be made equal to the load impedance at high frequencies.

The preferred embodiment taught herein is implemented in a passive 10× attenuator probe having a 500-ohm input impedance, a 50-ohm output impedance, and a 1.5 gigahertz pass band. Even though a series impedance is required to effect the desired divide-by-ten signal reduction, because of the manner in which the DC level shift mechanism is implemented, the level shift voltage provided via the probe tip to the signal source is attenuated only slightly so that a wide range of variable level shift voltage (also known as DC offset) is provided without limiting circuit bandwidth. Such a high-speed probe including the preferred embodiment of the present invention is particularly suited to ECL and TTL logic systems.

A more complete understanding of the present invention and its various features and advantages may be had by referring to the following detailed description and the accompanying drawing of the preferred embodiment.

DRAWING

The single FIGURE shows a detailed schematic diagram of a signal coupling circuit according to the preferred embodiment.

DETAILED DESCRIPTION OF THE PREFERRED EMBODIMENT

In the single FIGURE, a signal coupling circuit is shown in which both a high-frequency signal transmission path and a low-frequency signal transmission path are coupled between an input terminal 10 and an output terminal 12. A voltage generator ($e_g$) 14 is shown connected to input terminal 10, and it should be understood that such voltage generator may suitably represent the output of another circuit and as such may be, for example, a test point to be connected to an oscilloscope for viewing. Accordingly, the quiescent (DC) or average voltage or voltage generator 14 may be other than zero volts; for example, it may be the lower −1.7-volt level of an ECL circuit.

The high-frequency signal transmission path comprises a capacitor C1. The low-frequency signal transmission path, which is substantially in parallel with capacitor C1, comprises resistors R1, R2, R3, R4, R5, and R6. Resistors R2 and R4 are serially connected in the feedback path of an inverting operational amplifier, the active element of which is amplifier U1. Resistors R5 and R6, amplifier U2, and resistors R7 and R8 form a differential amplifier. Amplifiers U1 and U2 suitably may be commercially-available field-effect transistor (FET) input "op amps" with very high input impedance at the inverting (−) and non-inverting (+) inputs thereof. A load resistor R9 is shown connected between output terminal 12 and ground.

A resistor R10 is connected from the junction of resistors R1 and R2 to the inverting input of op amp U1 to isolate the high-frequency loading represented by the high stray capacitance of the op amp input from the signal source. Resistor R10 should have a fairly large value, e.g., 10 kilohms or higher, so that the dominant loading of the lower end of resistor R1 is resistor R2. Accordingly, resistor R2 should have a comparatively small value, e.g., less than one kilohm, so that any loading represented by resistor R10 is substantially negligible. A capacitor C2 may be connected from the output of op amp U1 to the inverting input thereof to provide a maximum, but controlled step response for the low-frequency transmission path. The value of capacitance chosen depends upon the particular op amp type used, with op amp stability and control of the response speed being the design criteria.

A capacitor C3 may be connected to ground from the junction of resistors R2 and R4 to form a phase-lead network which forces op amp U1 to compensate for the phase lag due to the finite bandwidth of op amp U2, delaying the current through resistor R1 by an amount equal to the phase-lag-caused delay of current in resistor R3. To explain further, in some situations the current delivered through resistor R2 to output terminal 12 from the output of op amp U2 is phase delayed compared with the input signal simply due to the rolloff of higher-frequency response through the low-frequency signal transmission path. As op amp U1 acts dynamically to maintain a "virtual ground" at the junction of resistors R1 and R2 by feeding back the required current to match the input signal current, capacitor C3 causes a delay just sufficient to allow the output of op amp U2 to respond. The net result is a smooth time changeover of the current into the R1-C1 node from capacitor C1 to resistor R1. If the phase-lead compensation network is not needed, as may be the case in fairly low-frequency coupling applications, resistors R2 and R4 may be replaced by a single feedback resistor. An optional series resistor R11 is included in the signal path between input terminal 10 and the junction of resistor R1 and capacitor C1 if the signal coupling circuit is to provide attenuation as well.

A potentiometer 16, which is disposed between a pair of suitable voltage supplies +V and −V, produces a variable level-shift voltage V1 at a movable wiper arm thereof. The level shift voltage V1 is applied to the non-inverting input of op amp U1 and to one end of resistor R7. Since it is a characteristic of inverting operational amplifiers for the inverting input to actively balance the potential applied to the non-inverting input, the level-shift voltage is transmitted to the operational amplifier null point or "virtual ground" at the junction of resistors R1 and R2. (There is no voltage drop across resistor R10 at DC and the low frequencies because there is no current through it due to the very high impedance of the FET input of op amp U1.) The level-shift voltage is adjusted to match the quiescent (DC) or average voltage of the signal source represented by signal generator 14; when this match is achieved, no current flows through resistor R1, not does any current flow through feedback resistors R2 and R4 in this condition. Thus, the level-shift voltage V1 is applied to the junction of resistors R4 and R5, matching the voltage V1 applied to resistor R7, and the output voltage V2 from the differential amplifier is zero volts, provided the resistance values of resistors R5, R6, R7, and R8 are properly selected. Generally, the ratios of values should be equal on the two sides of the amplifier to provide the symmetry required for common mode rejection. Thus, if resistors R5 and R6 are equal in value so as to provide unity gain, resistors R7 and R8 should be also be. In the preferred embodiment, all four resistors are the same value.

An example of how the level-shift voltage feature of the present invention may be used is in connecting to an oscilloscope a signal having a quiescent DC voltage level other than zero volts. With the ground-referenced oscilloscope trace at screen center, a passive signal acquisition probe containing the preferred embodiment is connected between the signal source and the oscilloscope input. The quiescent DC voltage level of the signal source, if other than ground potential, causes the trace to jump away from screen center to a distance represented by the DC voltage. Potentiometer 16 is then adjusted to bring the trace back to screen center; that is, a value of voltage V1 has been produced to match the DC level of the signal source so that voltage V2 at the output of op amp U2 is equal to zero volts.

A proposed commercial embodiment is a passive 10× attenuator probe having a 500-ohm input, a 50-ohm output, and a 1.5-gigahertz, bandwidth. Resistors R11 and R1 have values of 450 ohms and 50 ohms, respectively, providing both the desired 500-ohm input impedance and the divide-by-ten signal division. The 50-ohm, output impedance is provided by a 50-ohm coaxial cable connected between the junction of capacitor C1 and resistor R3 and the output terminal 12. The load resistor R9 may suitably be a 50-ohm resistor to terminate the coaxial transmission line. Resistors R5, R6, R7, and R8 are each 10-kilohm resistors, and resistor R3 is a one-kilohm resistor. It should be noted that resistor R3 appears in parallel with resistor R9 to signals passing through the high-frequency signal transmission path (capacitor C1), and thus should be chosen to be substantially larger than the load resistor. The effect of the resulting attenuation of the R3-R9 voltage divider ratio in the low-frequency signal transmission path may be cancelled by selecting the gain of the operational amplifier U1 (actually the ratio resistors R1 and R2) to be equal to the attenuation, as long as the gain of the differential amplifier U2 is one. The overall gain of the low-frequency path including the level-shifting operational amplifier (op amp U1 and its associated circuit elements including the R3-R9 divider) and the output differential amplifier (op amp U2 and its associated circuit elements) is unity so that there is no signal loss. Capacitor C1 has a value of one microfarad. The values of R2, R4, R10, C2, and C3 are selected to set the proper gain and step response and to provide an overall frequency response that is substantially flat over the entire 1.5-gigahertz frequency range. The level shift provided by this embodiment is approximately + and −5 volts.

While we have shown and described a preferred embodiment of our invention, it will be apparent to those skilled in the art that many changes may be made without departing from out invention in its broader aspects. The appended claims cover all such changes and modifications as fall therewithin.

What we claim as our invention is:
1. A signal coupling circuit, comprising:
an input terminal and an output terminal;
a high-frequency signal transmission path comprising
a capacitor coupled between said input terminal and said output terminal;

a low frequency signal transmission path comprising an operational amplifier and a differential amplifier connected in series between said input terminal and said output terminal; and a variable DC voltage source coupled to said operational amplifier.

2. A signal coupling circuit in accordance with claim 1 wherein said operational amplifier is an inverting operational amplifier having inverting and non-inverting inputs, a feedback path coupled between the output and inverting input of said operational amplifier, and an input resistor serially connected between the input terminal of said signal coupling circuit and said inverting input of said operational amplifier, and said variable voltage source comprises a potentiometer coupled to said non-inverting input of said operational amplifier.

3. A signal coupling circuit in accordance with claim 2 wherein said operational amplifier further comprises a phase-lead impedance network in the feedback path thereof to compensate for a phase-lag operating characteristic of said differential amplifier.

* * * * *